United States Patent
Wagner et al.

(10) Patent No.: US 7,648,818 B2
(45) Date of Patent: Jan. 19, 2010

(54) COMPOSITIONS AND METHODS FOR IMAGE DEVELOPMENT OF CONVENTIONAL CHEMICALLY AMPLIFIED PHOTORESISTS

(75) Inventors: Mark Wagner, Raleigh, NC (US); James DeYoung, Durham, NC (US)

(73) Assignee: MiCell Technologies, Inc., Raleigh, NC (US)

( * ) Notice: Subject to any disclaimer, the term of this patent is extended or adjusted under 35 U.S.C. 154(b) by 304 days.

(21) Appl. No.: 11/348,050

(22) Filed: Feb. 6, 2006

(65) Prior Publication Data
US 2007/0003864 A1 Jan. 4, 2007

Related U.S. Application Data

(63) Continuation-in-part of application No. 11/088,171, filed on Mar. 23, 2005, which is a continuation-in-part of application No. 11/045,791, filed on Jan. 28, 2005.

(51) Int. Cl.
*H01L 21/00* (2006.01)
*G03C 1/00* (2006.01)
(52) U.S. Cl. .................................. 430/311; 430/270.1
(58) Field of Classification Search ............. 430/270.1, 430/311, 313, 325, 326; 510/175
See application file for complete search history.

(56) References Cited

U.S. PATENT DOCUMENTS

| | | | |
|---|---|---|---|
| 4,377,710 A | 3/1983 | Seale et al. | |
| 5,532,106 A | 7/1996 | Fréchet et al. | |
| 5,532,113 A | 7/1996 | Fréchet et al. | |
| 5,536,616 A | 7/1996 | Fréchet et al. | |
| 5,545,509 A * | 8/1996 | Cameron et al. | 430/270.1 |
| 5,648,196 A | 7/1997 | Fréchet et al. | |
| 5,665,527 A | 9/1997 | Allen et al. | |
| 5,773,190 A | 6/1998 | Oie et al. | |
| 5,866,005 A | 2/1999 | DeSimone et al. | |
| 5,944,996 A | 8/1999 | DeSimone et al. | |
| 6,001,418 A | 12/1999 | DeSimone et al. | |
| 6,083,565 A | 7/2000 | Carbonell et al. | |
| 6,280,911 B1 * | 8/2001 | Trefonas, III | 430/326 |
| 6,306,555 B1 | 10/2001 | Schulz et al. | |
| 6,379,874 B1 | 4/2002 | Ober et al. | |
| 6,500,605 B1 * | 12/2002 | Mullee et al. | 430/329 |
| 6,576,392 B1 | 6/2003 | Sato et al. | |
| 6,610,456 B2 * | 8/2003 | Allen et al. | 430/270.1 |
| 6,669,785 B2 * | 12/2003 | DeYoung et al. | 134/3 |
| 6,737,215 B2 | 5/2004 | Dammel et al. | |
| 6,737,225 B2 | 5/2004 | Miller | |

(Continued)

OTHER PUBLICATIONS

International Search Report and Written Opinion for International Application No. PCT/US2006/03156, mailed Jun. 27, 2006.

(Continued)

*Primary Examiner*—Cynthia H Kelly
*Assistant Examiner*—Connie P Johnson
(74) *Attorney, Agent, or Firm*—Myers Bigel Sibley & Sajovec, PA

(57) ABSTRACT

Methods for carrying out lithography with a carbon dioxide development system are described. This invention involves methods for preferential removal of the darkfield region of conventional chemically amplified positive tone resists. The carbon dioxide development systems include one or more derivatizing agents, which may be an onium salt or a neutral compound.

14 Claims, 1 Drawing Sheet

U.S. PATENT DOCUMENTS

| | | |
|---|---|---|
| 6,753,129 B2 | 6/2004 | Livesay et al. |
| 6,764,809 B2 | 7/2004 | DeSimone et al. |
| 6,787,286 B2 | 9/2004 | Szmanda et al. |
| 6,858,379 B2 | 2/2005 | Zampini et al. |
| 6,919,167 B2 * | 7/2005 | DeYoung et al. ............ 430/313 |
| 6,929,904 B2 * | 8/2005 | DeSimone ................. 430/331 |
| 7,033,089 B2 * | 4/2006 | Takasu et al. ............... 396/604 |
| 7,044,143 B2 | 5/2006 | DeYoung et al. |
| 7,044,376 B2 | 5/2006 | Nelson et al. |
| 7,235,347 B2 * | 6/2007 | Wagner et al. ............. 430/311 |
| 2002/0051929 A1 * | 5/2002 | Watanabe et al. .......... 430/192 |
| 2003/0047533 A1 | 3/2003 | Reid et al. |
| 2004/0091813 A1 | 5/2004 | Poss et al. |
| 2004/0096210 A1 * | 5/2004 | Takasu et al. ............... 396/564 |
| 2004/0096779 A1 | 5/2004 | DeSimone |
| 2004/0096783 A1 | 5/2004 | DeYoung et al. |
| 2005/0008976 A1 | 1/2005 | Sakamizu et al. |
| 2005/0008980 A1 | 1/2005 | Arena-Foster et al. |
| 2005/0170277 A1 | 8/2005 | Zannoni et al. |
| 2005/0208429 A1 * | 9/2005 | DeYoung et al. ............ 430/311 |
| 2005/0215746 A1 | 9/2005 | DeSimone et al. |
| 2005/0227183 A1 | 10/2005 | Wagner et al. |
| 2006/0003271 A1 | 1/2006 | Clark et al. |

OTHER PUBLICATIONS

Cameron, James F., et al., Photogeneration of amines from α-keto carbamates: design and preparation of photoactive compounds, *J. Chem. Soc.*, 1:2429-2442 (1997).

Fréchet, Jean M.J., et al., Photogenerated Base in Resist and Imaging Materials: Design of Functional Polymers Susceptible to Base Catalyzed Decarboxylation, *Chem. Mater.*, 9: 2887-2893 (1997).

Havard, Jennifer M., et al., Functional Design of Environmentally enhanced Water-Soluble Positive-Tone Photoresists, *Polym. Mat. Sci. Eng.*, 77:424-5 (1997).

Jackson et al., Surfactants and Microemulsions in Supercritical Fluids; in Supercritical fluid cleaning; ed.J.Hardy (Noyes) 1998, ch. 5 pp. 87-120.

Pham, Victor Q., et al., Positive-Tone Resist for Supercritical $CO_2$ Processing, *Polymer Preprints*, 43(2): 885-6 (2002).

Sunderarajan et al., Supercritical CO2 processing for submicron imaging of fluoropolymers, *Chem. Mater.*, 12 41-48 (2000).

Urankar, Edward J., et al., Photogenerated Base in Polymer Curing and Imaging: Design of Reactive Styrenic Copolymers Susceptible to a Base-Catalyzed β-Elimination, *Journal of Polymer Science: Part A: Polymer Chemistry*, 35:3543-3552 (1997).

Urankar, Edward J., et al., Photogenerated Base in Polymer Curing and Imaging: Cross-Linking of Base-Sensitive Polymers Containing Enolizable Pendant Groups, *Chem. Mater.*, 9: 2861-2868 (1997).

Urankar, Edward J., et al., Base-Sensitive Polymers as Imaging Materials: Radiation-Induced β-Elimination to Yield Poly(4-hydroxystyrene), *Macromolecules*, 30: 1304-1310 (1997).

* cited by examiner (a)             (b)

COMPOSITIONS AND METHODS FOR IMAGE DEVELOPMENT OF CONVENTIONAL CHEMICALLY AMPLIFIED PHOTORESISTS

RELATED APPLICATIONS

This application is a continuation-in-part of commonly owned, copending application Ser. No. 11/088,171, filed Mar. 23, 2005, which is in turn a continuation-in-part of commonly owned, copending application Ser. No. 11/045,791, filed Jan. 28, 2005, the disclosures of both of which are incorporated by reference herein in their entirety.

FIELD OF THE INVENTION

The present invention concerns lithographic methods, particularly methods for the preferential removal of dark-field or light field regions which may be used to form patterned regions on substrates such as microelectronic substrates.

BACKGROUND OF THE INVENTION

In photolithography using chemically amplified resists, the area of photoresist film exposed to incident radiation undergoes a chemical transformation. For most resist systems designed for traditional aqueous base development, this transformation results in a significant increase in polarity. For these systems, traditionally termed positive tone resist systems, the exposed region is removed during development in aqueous base. Alternatively, for negative tone resists systems the exposed region becomes less polar, and/or increases in molecular weight through cross-linking reactions upon exposure to radiation making this region less soluble in the developer solution. For negative tone systems the non-exposed region is preferentially removed in the developer solution.

Aqueous solutions of tetramethyl ammonium hydroxide TMAH are typically used as the photoresist developer. In order for development in aqueous base to be effective, the base must deprotonate a certain number of Bronsted acid groups to allow the resist to become soluble. The amount of deprotonation required for photoresist solubility is known as the critical ionization level, and has been well described in the literature (see G. Willson, et al. J. Vac. Sci. Technol. B 20(2) March/April 2002, 537-543).

Feature sizes on microelectronic devices continue to shrink as these devices become smaller, faster and more powerful. The lithographic development of these smaller feature sizes in aqueous base can become problematic due to image collapse caused by the capillary forces and surface tension of water. Current approaches to solving this problem include IPA vapor drying and bilayer resist technology. The prevention of image collapse in supercritical $CO_2$ dryers for MEM's and other applications is based on the absence of surface tension in supercritical $CO_2$ to avoid surface tension and capillary forces. Each of these potential solutions for image collapse requires additional steps in the lithographic process leading to higher cost of ownership and decreased device yield.

Non-smooth edges on developed features become problematic as feature sizes get smaller (*Semiconductor International*; February 2005; p. 44). The roughness of a single edge is known as Line Edge Roughness (LER) and the roughness of a feature defined by two edges is known as Line Width Roughness (LWR). Current approaches to minimizing LER/LWR include modification of the photoresist, back anti-reflection coating (BARC) or etch chemistry, or use of a hard-mask. All of these approaches generally result in decreased imaging and/or etch performance of the resist, or require additional process steps that increase cost of ownership and decrease device yield. Densified $CO_2$ has the ability to penetrate and swell certain amorphous polymers. This facilitates delivery of chemistry into the swollen polymer, and can smooth out surface features. Under proper conditions, these properties can be used in lithography to smooth surfaces without affecting the critical dimensions of a feature.

Commercially available photoresists used for 248-nm lithography, 193-nm lithography, e-beam lithography, and those being developed for EUV-based lithography are not soluble in liquid or supercritical carbon dioxide in the exposed or unexposed state making $CO_2$-based development extremely challenging. Furthermore, Bronsted bases such as TMAH are neutralized in supercritical carbon dioxide which acts as a weak acid. As such, a pH above 7 is not readily accessible in $CO_2$ based systems. Under these conditions, the minimum level of ionization needed to dissolve exposed positive tone photoresist is not achievable.

In carbon dioxide solvent systems, low-polarity polymer species, specifically fluorinated polymers and siloxane-containing polymers are more soluble than polar polymers. This provides an obvious pathway for negative tone image development, as seen in U.S. Pat. No. 5,665,527 to Allen and U.S. Pat. No. 6,379,874 to Ober. However, for Allen and Ober, image transfer in the negative tone using dense CO2 utilizes non-commercial and in some cases impractical fluorinated or siloxane-containing polymers that are not proven resist systems and are unlikely to be adopted by the microelectronics industry.

Carbon dioxide based development systems that are compatible with traditional 248-nm, 193-nm, 157-nm, e-beam and EUV resists and leverage the physical properties of $CO_2$ as a processing fluid to give reduced image collapse and decreased LER/LWR are desirable.

SUMMARY OF THE INVENTION

A first aspect of the invention is a method for carrying out lithography with a carbon dioxide development system, comprising the steps of:

(a) providing a substrate, the substrate having a polymer resist layer formed thereon;

(b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;

(c) optionally baking the resist layer;

(d) contacting the resist layer to at least one derivatizing agent (e.g. in a solvent or carrier) under conditions in which the at least one light field or dark field region is preferentially modified with the derivitizing agents as compared to the at least one dark field or light field region; and then (e) contacting the resist layer with a rinse composition comprising, consisting of or consisting essentially of carbon dioxide such that the light or dark field is preferentially removed from the substrate.

A further aspect of the invention is a method for reducing image collapse during development of a resist layer with a carbon dioxide development system, comprising the steps of:

(a) providing a substrate, the substrate having a polymer resist layer formed thereon;

(b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;

(c) optionally baking the resist layer;

(d) contacting the resist layer to at least one derivatizing agent (e.g. in a solvent or carrier) under conditions in which the at least one light field or dark field region is preferentially modified with the derivitaizing agents as compared to the at least one dark field or light field region; and then (e) contacting the resist layer with a rinse composition comprising, consisting of or consisting essentially of carbon dioxide such that the light or dark field is preferentially removed from the substrate.

A further aspect of the invention is a method for reducing Line Edge Roughness (LER) and Line Width Roughness (LWR) of a resist layer with a carbon dioxide development system, comprising the steps of:

(a) providing a substrate, the substrate having a polymer resist layer formed thereon;

(b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;

(c) optionally baking the resist layer;

(d) contacting the resist layer to at least one derivatizing agent (e.g. in a solvent or carrier) under conditions in which the at least one light field or dark field region is preferentially modified with the derivitaizing agents as compared to the at least one dark field or light field region; and then (e) contacting the resist layer with a rinse composition comprising, consisting of or consisting essentially of carbon dioxide such that the light or dark field is preferentially removed from the substrate.

A further aspect of the invention is a carbon dioxide solvent system useful in carrying out preferential modification of the polymer as described above. In general, the system consists of liquid or supercritical CO2 containing a derivitizing agent that preferentially reacts with and modifies light field or dark field resist such that either the light field or dark field may be preferentially removed by CO2 wash A further aspect of the invention is a carbon dioxide solvent system useful in washing or rinsing away preferentially modified resist. In general, the system consists of liquid or supercritical CO2 that optionally may contain agents used for preferential modification of the resist and/or cosolvents to increase solubility of the modified resist.

BRIEF DESCRIPTION OF THE DRAWINGS

FIG. 2a is a top-down image of a dense line and space structure developed with a standard aqueous TMAH process that shows obvious surface roughness on the top and sidewalls. FIG. 2b shows an analogous structure developed with the described $CO_2$ based process using an ammonium salt. The structure imaged in 2b has noticeably less surface roughness on the top and sides of the line than the 2a structure.

DETAILED DESCRIPTION OF THE PREFERRED EMBODIMENTS

Figure 1:
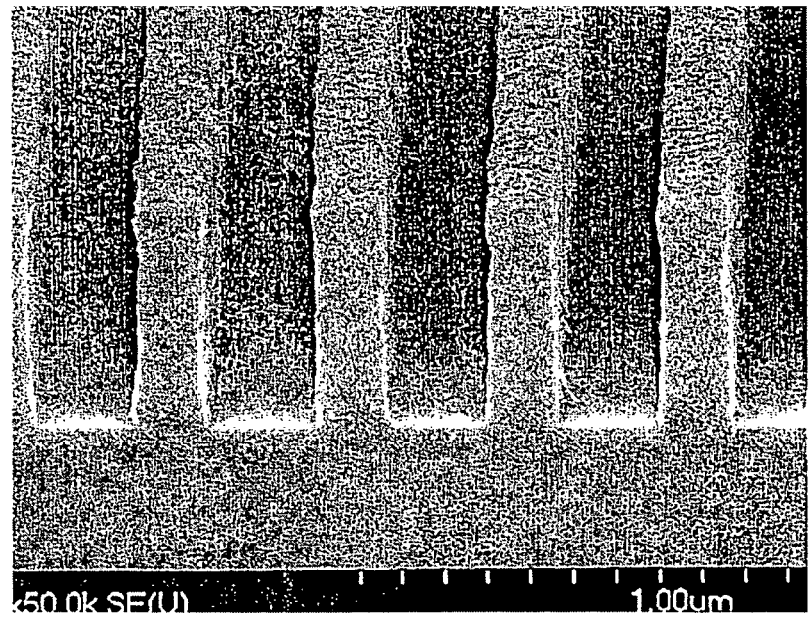
FIG. 1 is an SEM image of EUV photoresist developed using ammonium salts in supercritical $CO_2$ showing uncollapsed dense line and space structures with an aspect ratio of 6.9

The present invention is explained in greater detail in the specification set forth below. Applicants specifically intend that the disclosures of all United States patent references that are cited herein be incorporated herein by reference in their entirety.

1. Substrates and Coatings.

The present invention may be carried out on a variety of substrates, including microelectronic substrates, in which lithographic patterning is used to define features during the manufacturing process. As such, the invention may be used in the manufacture of semiconductors, miroelectromechanical devices (MEM's), optoelectronics, etc. The present invention can be carried out on substrates for these devices including silicon, germanium, gallium aresenide, indium phosphide, cadmium sulfide, zinc oxide, etc.

The resist layer typically comprising a polymer and a photoacid generator. Such photochemically active resists may be applied by spin coating from solvent or other suitable technique. The resist typically comprises a polymeric material, and may be a positive-acting resist or a negative-acting resist. Any suitable resist composition can be used in conjunction with the present invention, including but not limited to those described in U.S. Pat. Nos. 6,165,678; 6,103,866; 6,042,997; 5,989,776; 5,922,518; 5,866,304; 5,492,793; 5,443,690; 5,071,730; 4,980,264; and 4,491,628.

The resist preferably comprises or consists essentially of polymer and photoacid generator, along with other standard additives such as quenchers, etc, where the polymer is insoluble in $CO_2$ in both exposed and unexposed forms. In previous cases (for example U.S. Pat. No. 5,665,527 to Allen and U.S. Pat. No. 6,379,874 to Ober), negative tone development of resists that were specifically designed to be developed in $CO_2$ was claimed. Generally, incorporation of fluorocarbon groups or siloxane-based groups is required to make the prototype, non-conventional resists disclosed by Allen and Ober CO2-philic. These types of resists are not specifically designed to be developed in TMAH (Aqueous base), as are the resists useful in the current invention. Additionally, the prototype fluorinated or siloxane-based resists may or may not have the imaging and etch resistant properties already designed in the conventional non-fluorine, non-siloxane containing resists. The present invention can be used to develop commercially available resists that are designed to be developed in aqueous base. The $CO_2$ based development process described here can be used on photoresists that are currently being used in industry and have a proven history of performance.

For example, in some embodiments the resist composition includes a photosensitive acid generator, or photoacid generator, which may be an ionic or non-ionic photoacid generator. Upon exposure to radiation, the radiation-sensitive acid generator generates a strong acid. A variety of photosensitive acid generators can be used in the composition. Generally, suitable acid generators have a high thermal stability (preferably to temperatures greater than 160° C.) so they are not degraded during pre-exposure processing. Suitable acid generators include ionic iodonium sulfonates, e.g., diaryl iodonium (alkyl or aryl) sulfonate and bis-(di-t-butylphenyl)iodonium camphanylsulfonate; aryl (e.g., phenyl or benzyl)

triflates and derivatives and analogs thereof, e.g., triphenylsulfonium triflate or bis-(t-butyl phenyl)iodonium triflate; pyrogallol derivatives (e.g., trimesylate of pyrogallol); onium salts such as triarylsulfonium and diaryliodonium hexafluoroantimonates, hexafluoroarsenates, trifluoromethane sulfonates and others; trifluoromethanesulfonate esters of hydroxyimides, alpha,alpha'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), Chemistry of Materials 3:395. Additional suitable acid generators useful in conjunction with the compositions and methods of the invention will be known to those skilled in the art and/or described in the pertinent literature (see U.S. Pat. No. 6,165,678).

The resist composition may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The resist composition may additionally, if necessary or desirable, include additional materials (known to those skilled in the art) such as antireflective layers. The resist composition may also contain additional materials such as second thin film layers creating multi-layer resist compositions typically used to enhance etch resistance.

2. Derivatizing Agents.

Derivitizing agents in the present invention are used to preferentially modify dark field or light field resist so that the modified resist becomes soluble in a CO2 solution. It is expected that derivitizing agents will react with Bronsted acid groups in the resist, typically phenol or acrylic acid groups for standard photoresists designed for development in TMAH. Preferential modification of the resist may take place in multiple steps using more than one derivitizing agent, in which at least one of the derivitizing steps, the derivitizing agent reacts preferentially with dark field or light field resist. Also, in at least one of the derivitization steps, the derivitizing agent contains CO2 soluble groups such as silicone, siloxane or organofluorine groups. Resist modification using derivitizing agents may be done in traditional solvents or in densified CO2. The mechanism by which the derivitizing agents react preferentially with dark or light field resist is not specified because it will vary depending on several factors including the structure of the photoresist polymer, relative deprotection ratios between light and dark field resists, photoresist composition, post exposure bake conditions, the type of derivitizing agent, and reaction conditions of the derivitization step. In one specific example, the reaction between onium salt derivitizing agents and Bronsted acid groups in the resist is inhibited by exposed PAG in the light field. This results in preferential modification and subsequent removal of dark field resist.

A. Neutral (uncharged) derivatizing agents. Derivitizing agents that will react with Bronsted acid groups or their derivatives in the resist (such as phenols, acrylic acid groups, acid chlorides, acid anhydrides) include but are not limited to alkyl halides, aryl halides, acyl halides, alcohols, phenols, thionyl chloride, phosphorous pentachloride, oxallyl chloride, carbonyldiimidazoles, dicyclohexylcarbodiimides, alkylthiols, aryl thiols, thiol esters, disulfides, thiochloroformates, acid anhydrides, carboxylic acids, lithium diorgano cuprates, diorgano cadmium reagents, alkylamines, aryl amines, pyridines, pyridiniums and isocyanates B. Onium salts. Derivatizing agents that may be used to carry out the present invention include onium salts such as sulfonium, diazonium, phosphonium, iodonium and ammonium complexes or salts.

(i) Sulfonium salts. Sulfonium salts or complexes used to carry out the present invention are, in general, compounds of formula i:

Compounds of formula i preferably contain at least one organic group that is considered $CO_2$-philic. $CO_2$-philic groups can be partially or wholly fluorinated, or can consist of siloxane-based or siloxane-containing substituents. Each group $R^1$, $R^2$, $R^3$, (sometimes referred to as '$R_f$' groups herein) can be aliphatic or aromatic in nature or be combinations of both moieties Some or all can be $CO_2$-philic. Ideally, when the group $R_f$ contains fluorine, the group is attached to the sulfur center through a non-fluorinated linking group (e.g., $R_f$— is a group of the formula $R_aR_b$—, where $R_a$ is a fluorine-containing group and $R_b$ is a non-halogenated or non-fluorinated linking group). This is to minimize the inductive effect of fluorinated groups (a very electronegative atom) on the sulfur. The prototypical $CO_2$-philic group $R_f$— is represented by the formula $R_aR_b$—, where $R_a$ is a perfluoroalkyl, perfluoroether, or perfluoroaryl group, and $R_b$ is a linking group, typically a C1-C6 aliphatic (linear, non-linear, branched, non-branched, saturated or non-saturated.), aromatic, or a C1-C6 hydrocarbon group such as —$CH_2CH_2CH_2$—, where the fluorocarbon group is attached to the linking group and the linking group is attached to the sulfur such that the sulfur is not directly attached to the fluorocarbon. In the case where the linking group $R_b$ is aromatic, a C6 aromatic group is favored. Preferably, the compound contains two or three $CO_2$-philic groups, $R^1$, $R^2$, $R^3$, Additional CO2-philic groups could be utilized such as silicone-based moieties and carbonyl-containing moieties such as acetate, ether carbonate. Typically, and preferably, one or more of the groups is not a $CO_2$-philic group. Of the non-$CO_2$-philic groups, $R^1$ through $R^3$, typically one group is a C1-C6 aliphatic or C1-C6 hydrocarbon group such as a methyl, ethyl, propyl, butyl, or hexyl group.

The negatively charge ion, represented by the formula X—, is in some embodiments selected from a large group of negatively charged ions. The ion, X—, can be hydroxide, or any atom or group of atoms capable of supporting an extra valence electron. Prototypical examples include: halides, (F, Cl, Br, I), oxides, carboxylates, borates, cyanates, alkoxides, sulfides, phosphides, phosphates, tosylates, antimonates, arsenates, halogenates, cyanides, nitrates, nitrites, thiocyanates, sulfonates and other organic and inorganic anions. The anion may or may not contain fluorine or fluorinated substituents.

In one preferred embodiment $R^1$ is different from $R^2$, $R^3$,. This causes the cation to be asymmetric.

(ii) Diazonium salts. Diazononium salts or complexes used to carry out the present invention are, in general, compounds of formula ii:

wherein $R^1$ is as given above in connection with sulfonium salts above and $X^-$ is a counterion.

(iii) Phosphonium salts. Phosphonium salts or complexes used to carry out the present invention are, in general, compounds of formula iii:

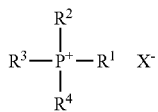
(iii)

wherein $R^1$, $R^2$, $R^3$, $R^4$ and $X^-$ are as given above.

(iv) Iodonium salts. Iodonium salts or complexes used to carry out the present invention are, in general, compounds of formula iv:

(iv)

wherein $R^1$, $R^2$ and $X^-$ are as given in connection with sulfonium salts and formula i above.

(v) Oxonium salts. Oxonium salts or complexes used to carry out the present invention are, in general, compounds of the formula v or v'.

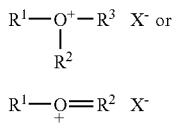
(v)
(v')

wherein $R^1$, $R^2$, $R^3$ and $X^-$ are as given above.

(vi) Ammonium salts. Ammonium salts or complexes used to carry out the present invention are, in general, compounds of formula vi:

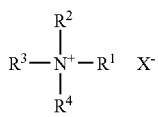
(iv)

wherein $R^1$, $R^2$, $R^3$, $R^4$ and $X^-$ are as given above. For the ammonium complexes described in this invention, significant property differences for various combinations of cations and anions were observed. For ammonium complexes, low ion pair energy is favored by ions that are large and unsymmetrical (Copenhafer, et al.; *J. Am. Chem. Soc.*; 1951; 73(10); 4557-4561). Generally, we observed that increasing the size and/or the asymmetry of the component ions of our ammonium complex resulted in greater reactivity. With this understanding, we have determined that ammonium complexes of low ion pair energy are more effective in this invention than those with higher ion pair energies. Preferred ammonium complexes have an ion pair energy that is less than that of $(R^1)_2Me_2N^+Cl^-$, where $R^1$ is $C_3F_7CH_2CH_2CH_2$—.

Resist modification reactions using some of the example neutral (uncharged) derivitizing agents are provided in Scheme 1 and Scheme 2.

Scheme 1: Reactions with Phenols

1. Ether synthesis

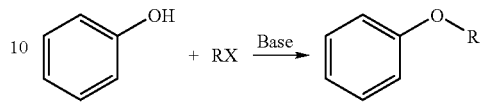

2. Freidel-Craft Alkylation

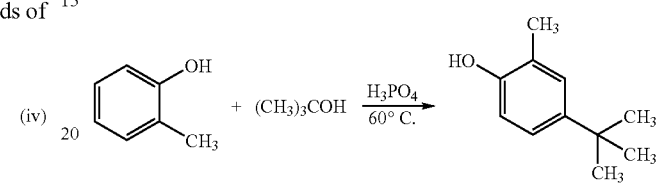

3. Freidel-Craft Acylation with Lewis acid

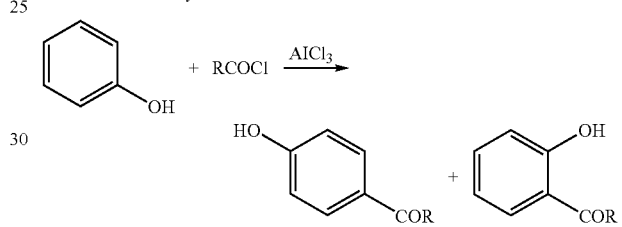

4. Friedel-Craft Acylation without Lewis Acid

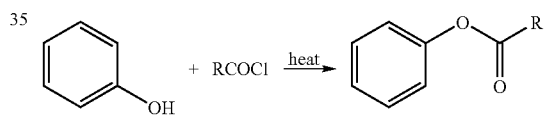

5. Diazonimum salts.

6. Fischer esterification

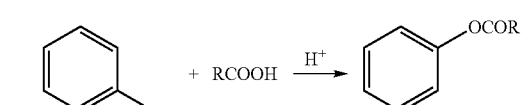

Note: In all cases, RCOCl may be substituted with acid anhydrides, RC(=O)OC(=O)R.

Scheme 2: Reactions with CO$_2$H and derivatives.

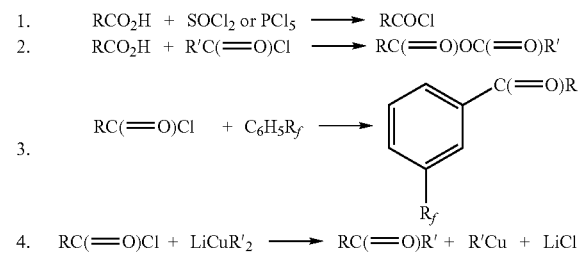

-continued

5. $RC(=O)Cl + R'_2Cd \longrightarrow RC(=O)R' + R'CdCl$

6. $RC(=O)Cl + R'CO_2H \longrightarrow RC(=O)OC(=O)R' + HCl$

7. $RC(=O)Cl + R'OH \longrightarrow RC(=O)OR' + HCl$

8. $RC(=O)Cl + R'_2NH \longrightarrow RC(=O)NR'_2 + H_2O + Cl^-$

Notes:

--Acid anhydrides as in Scheme 1 can be substituted for acid chlorides in reactions 2-8.
--For reactions 2, 6, and 7, either of the two reactants may be part of the resist.

3. Derivatizing Agent Compositions.

The preferential modification of the resist with derivitizing agents may or may not take place in CO2. If a derivitization step does take place in CO2, derivitization and preferential removal of the modified resist may take place using the same CO2 solution or a second CO2 solution. Carbon-dioxide solvent or derivitization systems used to carry out the present invention typically comprise, consist of, or consist essentially of:

(a) optionally, where desired, a derivitizing agent as described above, typically from 0.1, 0.5% or 1.5% to 10 or 20 percent by weight;

(b) carrier liquid (e.g., carbon dioxide, water, an organic solvent or combination thereof) to balance, typically at least 40, 50 60, or 70 percent;

(c) optionally, where desired, from 0, 0.01, 0.1, 0.5, 1 or 2 percent to 5 or 10 percent or more of surfactant (in some embodiments preferably a $CO_2$-philic surfactant);

(d) optionally, where desired, from 0, 0.01, 0.1, 1 or 2 to 30, 40 or 50 percent or more of an organic co-solvent; and (e) optionally, and in some embodiments less preferably, from 0.01, or 0.1 to 2, 5 or 10 percent water (and in other embodiments 0 percent water).

Percentages herein are expressed as percentages by weight unless otherwise indicated.

The composition may be provided as a liquid or supercritical fluid, including cryogenic liquids. Liquid and supercritical carbon dioxide are herein together referred to as "densified" carbon dioxide in accordance with established usage.

The organic co-solvent may be one compound or a mixture of two or more ingredients. The organic co-solvent may be or comprise an alkane, an alcohol (including diols, triols, etc.) including halogenated aliphatic or aromatic alcohols, ether, hydrofluoroether, perfluoroether, amine, ketone, carbonate, or alkanes, or hydrocarbon, or fluorocarbon (aliphatic or aromatic). The organic co-solvent may be a mixture of compounds, such as mixtures of alkanes, or mixtures of one or more alkanes in combination with additional compounds such as one or more alcohols as described above. (e.g., from 0 or 0.1 to 5% of a C1 to C15 alcohol (including diols, triols, etc.)).

Any surfactant can be used to carry out the present invention, including both surfactants that contain a $CO_2$-philic group (such as described in PCT Application WO96/27704 or U.S. Pat. No. 5,783,082) linked to a $CO_2$-phobic group (e.g., a lipophilic group) and surfactants that do not contain a $CO_2$-philic group (i.e., surfactants that comprise a hydrophilic group linked to a hydrophobic (typically lipophilic) group). A single surfactant may be used, or a combination of surfactants may be used. Numerous surfactants are known to those skilled in the art. See, e.g., McCutcheon's Volume 1: Emulsifiers & Detergents (1995 North American Edition) (MC Publishing Co., 175 Rock Road, Glen Rock, N.J. 07452). Examples of the major surfactant types that can be used to carry out the present invention include the: alcohols, alkanolamides, alkanolamines, alkylaryl sulfonates, alkylaryl sulfonic acids, alkylbenzenes, amine acetates, amine oxides, amines, sulfonated amines and amides, betaine derivatives, block polymers, carboxylated alcohol or alkylphenol ethoxylates, carboxylic acids and fatty acids, a diphenyl sulfonate derivatives, ethoxylated alcohols, ethoxylated alkylphenols, ethoxylated amines and/or amides, ethoxylated fatty acids, ethoxylated fatty esters and oils, fatty esters, fluorocarbon-based surfactants, glycerol esters, glycol esters, hetocyclic-type products, imidazolines and imidazoline derivatives, isethionates, lanolin-based derivatives, lecithin and lecithin derivatives, lignin and lignin derivatives, maleic or succinic anhydrides, methyl esters, monoglycerides and derivatives, olefin sulfonates, phosphate esters, phosphorous organic derivatives, polyethylene glycols, polymeric (polysaccharides, acrylic acid, and acrylamide) surfactants, propoxylated and ethoxylated fatty acids alcohols or alkyl phenols, protein-based surfactants, quaternary surfactants, sarcosine derivatives, silicone-based surfactants, soaps, sorbitan derivatives, sucrose and glucose esters and derivatives, sulfates and sulfonates of oils and fatty acids, sulfates and sulfonates ethoxylated alkylphenols, sulfates of alcohols, sulfates of ethoxylated alcohols, sulfates of fatty esters, sulfonates of benzene, cumene, toluene and xylene, sulfonates of condensed naphthalenes, sulfonates of dodecyl and tridecylbenzenes, sulfonates of naphthalene and alkyl naphthalene, sulfonates of petroleum, sulfosuccinamates, sulfosuccinates and derivatives, taurates, thio and mercapto derivatives, tridecyl and dodecyl benzene sulfonic acids, etc.

Particular preferred embodiments of solvent systems that may be utilized herein are described in greater detail below.

4. Development or Rinse Systems.

In one embodiment of the invention, the polarity of the polymer resist in the light-field region is increased by the radiant energy. In another embodiment of the invention, the molecular weight of the polymer resist in the light-field region is decreased by the radiant energy. These changes are examples of a "chemical switch" or "chemical shift". Of course, the two processes (increased polarity, decreased molecular weight) may occur concurrently with one another upon exposure of the polymer resist to radiant energy.

Dense phase carbon dioxide, liquid and supercritical $CO_2$ phases, have solvent properties that are significantly 'tuneable' over a large range of pressures and temperatures. Whereas conventional solvents and water may have density changes of <5% over a temperature range of 20° C., the density of liquid and supercritical $CO_2$ can change dramatically over the same range (e.g., 60% between 35° C. and 55° C. at 125 bar). The changes in fluid density as a function of pressure can also be significant as the pressure of supercritical $CO_2$ changes. At 55° C., the density of supercritical $CO_2$ fluid changes 125% between 100 and 200 bar. While fluid density does not completely account for the solubility or phase behavior properties of molecules in $CO_2$ fluid, it is a generally good indicator.

The current invention discloses a new class of materials and dense carbon dioxide compositions useful in the image development of conventional chemically amplified photoresists in liquid or supercritical carbon dioxide. In one embodiment, the preferential modification of the resist occurs in one step and the development agents are generally defined as onium salts and are specifically CO2-soluble onium salts, or onium salts that are soluble or highly dispersable in predominantly dense CO2 fluids (i.e. the CO2 fluid may contain minority quantities of cosolvents, dispersants, surfactants or mixtures of adjuncts.) Examples of suitable onium salts include ammonium, sulfonium, phosphonium, iodonium, diazonium, and oxonium complexes. Additionally the current invention discloses new methods for image transfer using these agents in dense carbon dioxide to generate reverse tone images from conventional positive tone resists. In a second embodiment, the preferential modification of the resist occurs in one or more steps using a variety of chemistries in any of the steps. Examples of potentially useful chemistries for these steps are shown in Scheme 1 and Scheme 2. Any of these steps may occur in CO2 or traditional organic solvents, as long as the final development process takes place in CO2.

In an example of the first embodiment, a composition containing dense CO2 and less than 5 mole percent of a CO2-soluble quaternary ammonium salt represented by the formula $(Rf)_2NMe_2^+X^-$ (where Rf is $CF_3CF_2CF_2CF_2CF_2CF_2CH_2CH_2CH_2$ and where $X^-$ is $I^-$), is used to develop a 248-nm exposed wafer coated with a conventional positive tone DUV photoresist composition. In this case, the $CO_2$ composition removes the non-exposed or "dark-field" region of the resist resulting in what may be termed "image reversal" of a conventionally positive tone resist.

5. Lithography Techniques.

In general, photolithography involves the transfer of a design on a mask to a printed image in resist/photoresist material on a semiconductor substrate. There are a number of commonly recognized physical factors that contribute to differences between the design and the printed image. Lithography is well known and the steps thereof in the context of the present invention may be carried out by any suitable technique, including but not limited to those described in *Introduction to Microlithography*, Eds. Thompson et al. (Washington, D.C.: American Chemical Society, 1994), and in U.S. Pat. Nos. 6,383,719; 6,162,577; 5,780,188; 5,736,281; and 5,532,090.

In some embodiments, the process for generating a resist image on a substrate comprises the steps of: (a) coating a substrate with a film comprising the resist composition; (b) imagewise exposing the film to radiation/radiant energy; (c) optionally baking the resist, (d) contacting the resist to at least one derivatizing agent (e.g., by contacting the resist to a composition comprising the derivatizing agent in a carrier liquid), and then (e) developing the image by rinsing with a carbon dioxide solvent system as described herein.

Step (a) involves coating the substrate with a film comprising the resist composition dissolved in a suitable solvent. Suitable substrates include but are not limited to those described above. The substrate may or may not be coated with an organic anti-reflective layer prior to deposition of the resist composition. Preferably, the surface of the substrate is cleaned before the film is deposited thereon. In some embodiments, before the film has been exposed to radiation, the film is heated to an elevated temperature of about 90-150° C. for a short period of time, typically on the order of about 1 minute. In some embodiments the dried film may have a thickness of about 0.1-5.0 microns, or more particularly about 0.2-1.0 microns.

Step (b), the film is imagewise exposed to x-ray, electron beam, ultraviolet radiation/light (including deep ultraviolet light and extreme ultraviolet (EUV) light), or other source of radiant energy. The radiation is sufficient to initiate a chemical reaction in the resist film to increase the polarity thereof and/or decrease the molecular weight thereof (e.g., by generating free acid which causes cleavage of an acid-cleavable substituent and formation of the corresponding acid or alcohol or other base soluble functional groups). The carbon dioxide can serve to dilate or swell the polymer resist and hence obviate the need for a post exposure bake step, or a post exposure bake step may optionally be utilized in accordance with known techniques.

Step (c), of baking is optional as noted above, as the presence of carbon dioxide in other steps of the process may obviate the need for a baking step.

Step (d), of contacting the resist layer to at least one derivatizing agent can be carried out as a single step or as a series of sub-steps. For example, for some derivatizing agents (such as onium salts) the carrier fluid can include carbon dioxide, and a single step can be employed. Alternatively, a first derivatizing agent (such as a oxallyl chloride) can be contacted to the resist layer to form a more active Bronsted acid group, and (simultaneously therewith or sequentially thereafter) a second derivatizing agent (such as a fluorinated amine) contacted to the resist layer to complete the derivitization and render the desired region soluble in carbon dioxide.

Step (e) involves removal of the resist region that has been derivatized, or preferentially modified with $CO_2$ soluble groups. This preferably takes place in a composition comprising carbon dioxide (preferably densified carbon dioxide such as liquid or supercritical carbon dioxide), and may occur at the same time as resist modification, or in a subsequent step.

The present invention is explained in greater detail in the following non-limiting Examples.

EXAMPLES

Reducing Line Edge Roughness and Line Width Roughness

FIG. 1 is an SEM image of EUV photoresist developed using ammonium salts in supercritical $CO_2$ as described herein, showing uncollapsed dense line and space structures with an aspect ratio of 6.9.

Figure 2:
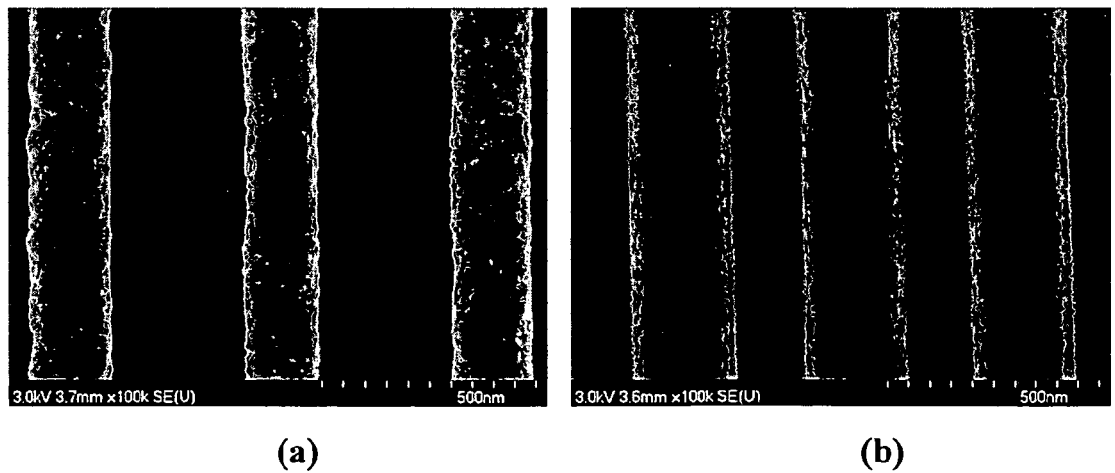
FIG. 2 contains SEM images that illustrate the benefit of the described $CO_2$ based development process for reducing Line Edge Roughnesss (LER) and Line Width Roughness (LWR).

FIG. 2 contains SEM images that illustrate the benefit of the described $CO_2$ based development process for reducing Line Edge Roughnesss (LER) and Line Width Roughness (LWR). FIG. 2*a* is a top-down image of a dense line and space structure developed with a standard aqueous TMAH process that shows obvious surface roughness on the top and sidewalls. FIG. 2*b* shows an analogous structure developed with the described $CO_2$ based process. The structure imaged in 2b has noticeably less surface roughness on the top and sides of the line than the 2a structure.

The foregoing is illustrative of the present invention, and is not to be construed as limiting thereof. The invention is defined by the following claims, with equivalents of the claims to be included therein.

That which is claimed is:

1. A method for carrying out lithography with a carbon dioxide development system, comprising the steps of:
   (a) providing a substrate, the substrate having a resist layer formed thereon, said resist layer comprising a polymer and a photoacid generator, wherein said polymer is insoluble in carbon dioxide;
   (b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;
   (c) optionally baking the resist layer;
   (d) contacting the resist layer to at least one derivatizing agent under conditions in which the at least one light field or dark field region is preferentially modified with the derivitaizing agents as compared to the at least one dark field or light field region, respectively; and then (e) contacting the resist layer with a rinse composition comprising carbon dioxide such that the light or dark field is preferentially removed from the substrate;

wherein said at least one derivatizing agent comprises an onium salt or a neutral uncharged compound.

2. The method of claim 1, wherein said at least one derivatizing agent comprises an onium salt.

3. The method of claim 1, wherein said at least one derivatizing agent comprises an ammonium salt.

4. The method of claim 1, wherein said at least one derivatizing agent comprises a compound selected from the group consisting of diazonium, sulfonium, iodonium, oxonium and phosphonium salts.

5. The method of claim 1, wherein said derivatizing agent is a neutral uncharged compound.

6. The method of claim 1, wherein said photoacid generator is an ionic photoacid generator.

7. The method of claim 1 wherein said photoacid generator is a non-ionic photoacid generator.

8. The method of claim 1, wherein said photoacid generator is an iodonium or sulfonium photoacid generator.

9. The method according to claim 1, wherein said rinse composition is a liquid.

10. The method according to claim 1, wherein said rinse composition is a supercritical fluid.

11. The method according to claim 1, wherein said substrate is a microelectronic substrate.

12. The method according to claim 1, wherein said radiant energy is EUV light.

13. The method according to claim 1, wherein said radiant energy is 193 nm light.

14. The method according to claim 1, wherein said radiant energy is 248 nm light.

* * * * *

UNITED STATES PATENT AND TRADEMARK OFFICE
CERTIFICATE OF CORRECTION

| | | |
|---|---|---|
| PATENT NO. | : 7,648,818 B2 | Page 1 of 3 |
| APPLICATION NO. | : 11/348050 | |
| DATED | : January 19, 2010 | |
| INVENTOR(S) | : Wagner et al. | |

It is certified that error appears in the above-identified patent and that said Letters Patent is hereby corrected as shown below:

In the Claims:
Please add Claims 18-45 after col. 14, line 18:

18. A method for reducing image collapse during development of a resist layer with a carbon dioxide development system, comprising the steps of:

(a) providing a substrate, the substrate having a resist layer formed thereon, said resist layer comprising a polymer and a photoacid generator, wherein said polymer is insoluble in carbon dioxide;
(b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;
(c) optionally baking the resist layer;
(d) contacting the resist layer to at least one derivatizing agent under conditions in which the at least one light field or dark field region is preferentially modified with the derivatizing agents as compared to the at least one dark field or light field region; and then
(e) contacting the resist layer with a rinse composition comprising carbon dioxide such that the light or dark field is preferentially removed from the substrate;
wherein said at least one derivatizing agent comprises an onium salt or a neutral uncharged compound.

19. The method of claim 18, wherein said at least one derivatizing agent comprises an onium salt.

20. The method of claim 18, wherein said at least one derivatizing agent comprises an ammonium salt.

Signed and Sealed this
Sixteenth Day of August, 2011

David J. Kappos
*Director of the United States Patent and Trademark Office*

CERTIFICATE OF CORRECTION (continued)
U.S. Pat. No. 7,648,818 B2

21. The method of claim 18, wherein said at least one derivatizing agent comprises a compound selected from the group consisting of diazonium, sulfonium, oxonium and phosphonium salts.

22. The method of claim 18, wherein said derivatizing agent is a neutral uncharged compound.

23. The method of claim 18, wherein said photoacid generator is an ionic photoacid generator.

24. The method of claim 18, wherein said photoacid generator is a non-ionic photoacid generator.

25. The method of claim 18, wherein said photoacid generator is an iodonium or sulfonium photoacid generator.

26. The method according to claim 18, wherein said carbon dioxide solvent system is a liquid.

27. The method according to claim 18, wherein said carbon dioxide solvent system is a supercritical fluid.

28. The method according to claim 18, wherein said substrate is a microelectronic substrate.

29. The method according to claim 18, wherein said radiant energy is EUV light.

30. The method according to claim 18, wherein said radiant energy is 193 nm light.

31. The method according to claim 18, wherein said radiant energy is 248 nm light.

32. A method for reducing Line Edge Roughness (LER) and Line Width Roughness (LWR) of a resist layer with a carbon dioxide development system, comprising the steps of:

(a) providing a substrate, the substrate having a resist layer formed thereon, said resist layer comprising a polymer and a photoacid generator, wherein said polymer is insoluble in carbon dioxide;
(b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;
(c) optionally baking the resist layer;

(d) contacting the resist layer to at least one derivatizing agent under conditions in which the at least one light field or dark field region is preferentially modified with the derivatizing agents as compared to the at least one dark field or light field region; and then
(e) contacting the resist layer with a rinse composition comprising carbon dioxide such that the light or dark field is preferentially removed from the substrate;
wherein said at least one derivatizing agent comprises an onium salt or a neutral uncharged compound.

33. The method of claim 32, wherein said at least one derivatizing agent comprises an onium salt.

34. The method of claim 32, wherein said at least one derivatizing agent comprises an ammonium salt.

35. The method of claim 32, wherein said at least one derivatizing agent comprises a compound selected from the group consisting of diazonium, sulfonium, iodonium, oxonium and phosphonium salts.

36. The method of claim 32, wherein said derivatizing agent is a neutral uncharged compound.

37. The method of claim 32, wherein said photoacid generator is an ionic photoacid generator.

38. The method of claim 32, wherein said photoacid generator is an non-ionic photoacid generator.

39. The method of claim 32, wherein said photoacid generator is an iodonium or sulfonium photoacid generator.

40. The method according to claim 32, wherein said rinse composition is a liquid.

41. The method according to claim 32, wherein said rinse composition is a supercritical fluid.

42. The method according to claim 32, wherein said substrate is a microelectronic substrate.

43. The method according to claim 32, wherein said radiant energy is EUV light.

44. The method according to claim 32, wherein said radiant energy is 193 nm light.

45. The method according to claim 32, wherein said radiant energy is 248 nm light.

UNITED STATES PATENT AND TRADEMARK OFFICE
CERTIFICATE OF CORRECTION

| | | |
|---|---|---|
| PATENT NO. | : 7,648,818 B2 | Page 1 of 5 |
| APPLICATION NO. | : 11/348050 | |
| DATED | : January 19, 2010 | |
| INVENTOR(S) | : Wagner et al. | |

It is certified that error appears in the above-identified patent and that said Letters Patent is hereby corrected as shown below:

Delete the title page and substitute therefore the attached title page showing the corrected number of claims in patent.

In the Claims:
Please add Claims 15-42 after col. 14, line 18:

15. A method for reducing image collapse during development of a resist layer with a carbon dioxide development system, comprising the steps of:

(a) providing a substrate, the substrate having a resist layer formed thereon, said resist layer comprising a polymer and a photoacid generator, wherein said polymer is insoluble in carbon dioxide;
(b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;
(c) optionally baking the resist layer;
(d) contacting the resist layer to at least one derivatizing agent under conditions in which the at least one light field or dark field region is preferentially modified with the derivatizing agents as compared to the at least one dark field or light field region; and then
(e) contacting the resist layer with a rinse composition comprising carbon dioxide such that the light or dark field is preferentially removed from the substrate;
wherein said at least one derivatizing agent comprises an onium salt or a neutral uncharged compound.

This certificate supersedes the Certificate of Correction issued August 16, 2011.

Signed and Sealed this
Sixth Day of September, 2011

David J. Kappos
*Director of the United States Patent and Trademark Office*

CERTIFICATE OF CORRECTION (continued)
U.S. Pat. No. 7,648,818 B2

16. The method of claim 15, wherein said at least one derivatizing agent comprises an onium salt.

17. The method of claim 15, wherein said at least one derivatizing agent comprises an ammonium salt.

18. The method of claim 15, wherein said at least one derivatizing agent comprises a compound selected from the group consisting of diazonium, sulfonium, oxonium and phosphonium salts.

19. The method of claim 15, wherein said derivatizing agent is a neutral uncharged compound.

20. The method of claim 15, wherein said photoacid generator is an ionic photoacid generator.

21. The method of claim 15, wherein said photoacid generator is a non-ionic photoacid generator.

22. The method of claim 15, wherein said photoacid generator is an iodonium or sulfonium photoacid generator.

23. The method according to claim 15, wherein said carbon dioxide solvent system is a liquid.

24. The method according to claim 15, wherein said carbon dioxide solvent system is a supercritical fluid.

25. The method according to claim 15, wherein said substrate is a microelectronic substrate.

26. The method according to claim 15, wherein said radiant energy is EUV light.

27. The method according to claim 15, wherein said radiant energy is 193 nm light.

28. The method according to claim 15, wherein said radiant energy is 248 nm light.

29. A method for reducing Line Edge Roughness (LER) and Line Width Roughness (LWR) of a resist layer with a carbon dioxide development system, comprising the steps of:

(a) providing a substrate, the substrate having a resist layer formed thereon, said resist layer comprising a polymer and a photoacid generator, wherein said polymer is insoluble in carbon dioxide;
(b) exposing at least one portion of the resist layer to radiant energy causing a chemical shift to take place in the exposed portion and thereby form at least one light field region in the resist layer while concurrently maintaining at least one portion of the resist layer unexposed to the radiant energy to thereby form at least one dark field region in the polymer resist layer;
(c) optionally baking the resist layer;
(d) contacting the resist layer to at least one derivatizing agent under conditions in which the at least one light field or dark field region is preferentially modified with the derivatizing agents as compared to the at least one dark field or light field region; and then
(e) contacting the resist layer with a rinse composition comprising carbon dioxide such that the light or dark field is preferentially removed from the substrate;
wherein said at least one derivatizing agent comprises an onium salt or a neutral uncharged compound.

30. The method of claim 29, wherein said at least one derivatizing agent comprises an onium salt.

31. The method of claim 29, wherein said at least one derivatizing agent comprises an ammonium salt.

32. The method of claim 29, wherein said at least one derivatizing agent comprises a compound selected from the group consisting of diazonium, sulfonium, iodonium, oxonium and phosphonium salts.

33. The method of claim 29, wherein said derivatizing agent is a neutral uncharged compound.

34. The method of claim 29, wherein said photoacid generator is an ionic photoacid generator.

35. The method of claim 29, wherein said photoacid generator is an non-ionic photoacid generator.

36. The method of claim 29, wherein said photoacid generator is an iodonium or sulfonium photoacid generator.

37. The method according to claim 29, wherein said rinse composition is a liquid.

38. The method according to claim 29, wherein said rinse composition is a supercritical fluid.

39. The method according to claim 29, wherein said substrate is a microelectronic substrate.

40. The method according to claim 29, wherein said radiant energy is EUV light.

CERTIFICATE OF CORRECTION (continued)
U.S. Pat. No. 7,648,818 B2

41. The method according to claim 29, wherein said radiant energy is 193 nm light.

42. The method according to claim 29, wherein said radiant energy is 248 nm light.

(12) United States Patent
Wagner et al.

(10) Patent No.: US 7,648,818 B2
(45) Date of Patent: Jan. 19, 2010

(54) COMPOSITIONS AND METHODS FOR IMAGE DEVELOPMENT OF CONVENTIONAL CHEMICALLY AMPLIFIED PHOTORESISTS

(75) Inventors: Mark Wagner, Raleigh, NC (US); James DeYoung, Durham, NC (US)

(73) Assignee: MiCell Technologies, Inc., Raleigh, NC (US)

(*) Notice: Subject to any disclaimer, the term of this patent is extended or adjusted under 35 U.S.C. 154(b) by 304 days.

(21) Appl. No.: 11/348,050

(22) Filed: Feb. 6, 2006

(65) Prior Publication Data
US 2007/0003864 A1    Jan. 4, 2007

Related U.S. Application Data

(63) Continuation-in-part of application No. 11/088,171, filed on Mar. 23, 2005, which is a continuation-in-part of application No. 11/045,791, filed on Jan. 28, 2005.

(51) Int. Cl.
*H01L 21/00* (2006.01)
*G03C 1/00* (2006.01)

(52) U.S. Cl. .................... 430/311; 430/270.1

(58) Field of Classification Search ......... 430/270.1, 430/311, 313, 325, 326; 510/175
See application file for complete search history.

(56) References Cited

U.S. PATENT DOCUMENTS

| | | |
|---|---|---|
| 4,377,710 A | 3/1983 | Seale et al. |
| 5,532,106 A | 7/1996 | Fréchet et al. |
| 5,532,113 A | 7/1996 | Fréchet et al. |
| 5,536,616 A | 7/1996 | Fréchet et al. |
| 5,545,509 A * | 8/1996 | Cameron et al. ......... 430/270.1 |
| 5,648,196 A | 7/1997 | Fréchet et al. |
| 5,665,527 A | 9/1997 | Allen et al. |
| 5,773,190 A | 6/1998 | Oie et al. |
| 5,866,005 A | 2/1999 | DeSimone et al. |
| 5,944,996 A | 8/1999 | DeSimone et al. |
| 6,001,418 A | 12/1999 | DeSimone et al. |
| 6,083,565 A | 7/2000 | Carbonell et al. |
| 6,280,911 B1 * | 8/2001 | Trefonas, III ............. 430/326 |
| 6,306,555 B1 | 10/2001 | Schulz et al. |
| 6,379,874 B1 | 4/2002 | Ober et al. |
| 6,500,605 B1 * | 12/2002 | Mullee et al. ............. 430/329 |
| 6,576,392 B1 | 6/2003 | Sato et al. |
| 6,610,456 B2 * | 8/2003 | Allen et al. ............ 430/270.1 |
| 6,669,785 B2 * | 12/2003 | DeYoung et al. ............ 134/3 |
| 6,737,215 B2 | 5/2004 | Dammel et al. |
| 6,737,225 B2 | 5/2004 | Miller |

(Continued)

OTHER PUBLICATIONS

International Search Report and Written Opinion for International Application No. PCT/US2006/03156, mailed Jun. 27, 2006.

(Continued)

*Primary Examiner*—Cynthia H Kelly
*Assistant Examiner*—Connie P Johnson
(74) *Attorney, Agent, or Firm*—Myers Bigel Sibley & Sajovec, PA

(57) ABSTRACT

Methods for carrying out lithography with a carbon dioxide development system are described. This invention involves methods for preferential removal of the darkfield region of conventional chemically amplified positive tone resists. The carbon dioxide development systems include one or more derivatizing agents, which may be an onium salt or a neutral compound.

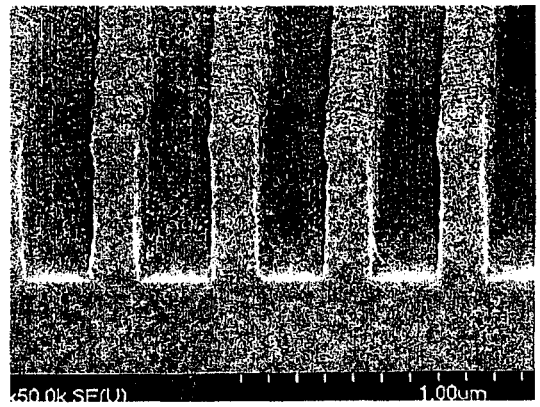

42 Claims, 1 Drawing Sheet